United States Patent [19]

Hasegawa et al.

[11] Patent Number: 4,720,688
[45] Date of Patent: Jan. 19, 1988

[54] FREQUENCY SYNTHESIZER

[75] Inventors: Makoto Hasegawa, Tokyo; Koei Misaizu, Kawasaki; Sadahiko Yamashita, Sagamihara, all of Japan

[73] Assignee: Matsushita Electric Industrial Co., Ltd., Osaka, Japan

[21] Appl. No.: 862,945

[22] Filed: May 14, 1986

[30] Foreign Application Priority Data

| May 15, 1985 | [JP] | Japan | 60-103024 |
| May 15, 1985 | [JP] | Japan | 60-103026 |
| Dec. 16, 1985 | [JP] | Japan | 60-283313 |
| Dec. 16, 1985 | [JP] | Japan | 60-283314 |
| Dec. 16, 1985 | [JP] | Japan | 60-283315 |
| Dec. 16, 1985 | [JP] | Japan | 60-283316 |

[51] Int. Cl.$^4$ ............................................. H03L 7/06
[52] U.S. Cl. ........................................ 331/2; 331/16; 331/18; 331/46; 331/179
[58] Field of Search ............ 331/2, 25, 16, 18, 46–48, 331/50, 56, 179; 455/260

[56] References Cited

U.S. PATENT DOCUMENTS

| 4,331,932 | 5/1982 | Remy | 331/2 |
| 4,388,597 | 6/1983 | Bickley et al. | 331/2 |
| 4,528,522 | 7/1985 | Matsuura | 331/2 |

Primary Examiner—Eugene R. LaRoche
Assistant Examiner—David Mis
Attorney, Agent, or Firm—Spencer & Frank

[57] ABSTRACT

A microwave frequency synthesizer comprised of a phase-locked loop having a low noise and highly stabilized reference voltage-controlled oscillator and further two phase-locked loops each having a stabilized voltage controlled oscillator, the signal outputs from which are frequency-converted with as small multiplication factors as possible. This frequency synthesizer can minimize the phase noise that may be generated by frequency dividers in a digital system.

24 Claims, 7 Drawing Figures

FIG. I  PRIOR ART

FREQUENCY SYNTHESIZER

BACKGROUND OF THE INVENTION

1. Field of the Invention

This invention relates to a microwave frequency synthesizer used as a local oscillator in a transmitter or receiver in satellite communication, for example.

2. Description of the Prior Art

In recent years, microwave frequency synthesizers have been prevalently used as local oscillators in transmitters or receivers in sattelite communication and as signal sources for evaluating microwave devices. These microwave frequency synthesizers are disclosed in the reference: "Frequency Synthesizers, Theory and Design" by Vadio Manasewitsch, Chapter 7, FIG. 7-30, for examples.

Now referring to FIG. 1, the principal theory of a previously known microwave frequency synthesizer will be explained below.

First, a phase comparator 1 compares a signal from a voltage control oscillator 6 divided by divider 5 with a signal from a reference oscillator 2 divided by divider 3 to take a phase lock therebetween. A voltage control oscillator 6 sends to a mixer 7 an oscillation signal corresponding to an output signal from loop filter 4. Mixer 7 adds the oscillation signal to the signal sent from reference oscillator 2 via a multiplier 8 and sends the result to a multiplier 9 where it is multiplied.

It is considered that in actual cases, an output of 6550 MHz to 7050 MHz is obtained at an terminal 10 by setting the frequency of reference oscillator 2 at 5 MHz, the multiplication factor of multiplier 8 at 81, and that of multiplier 9 at 20.

In the arrangement as mentioned above, however, the phase noise is degraded each multiplication, and for example, N time multiplication results in a phase noise degradation of $20 \log N$ dB. Actually, with $N=20$, the phase noise is degraded by 26 dB so that the phase noise of $-100$ dB/Hz is degraded to that of $-74$ dB/Hz.

Further, in the arrangement with an increase in frequency division number for phase comparison, there has occured a problem that the noise produced from a frequency divider or phase-locked loop PLL.IC is enhanced in its floor and the comparison frequency in the loop leaks in the synthesizer output. If the comparison frequency in the loop cannot be set at a higher value, the low nosie cannot be realized by means of setting higher the natural frequency in the loop.

SUMMARY OF THE INVENTION

An object of this invention is to provide a low-noise microwave frequency synthesizer with less phase noise degradation.

In order to attain this object, in accordance with one aspect of this invention, there is provided a frequency synthesizer comprising a first phase-locked loop means having a first voltage-controlled oscillator phase-lock stabilized using a reference quartz oscillator, a second phase-locked loop means having a second voltage-controlled oscillator for providing a phase comparison signal by frequency-converting a multiplied output signal from said first voltage-controlled oscillator with its own output signal, a third phase-locked loop means having a third voltage controlled oscillator for providing another phase comparison signal by frequency-converting another multiplied output signal from said first voltage-controlled oscillator with its own output signal, and frequency-converting means for frequency-converting a multiplied output from said second voltage controlled oscillator and another multiplied output from said third voltage controlled oscillator.

In accordance with another aspect of this invention, there is provided a frequency synthesizer comprising a voltage controlled quartz oscillator stabilized in its temperature characteristic in a thermoregulator bath, two phase-locked loops using the signal from the above voltage controlled quartz oscillator as a reference, and a further phase-locked loop using as a reference the output from one of said phase locked loops which provides a signal at a variable frequency, in which a high phase-comparison frequency is used to prevent the leak of the phase comparison frequency component and the signal output stabilized here is frequency-converted to provide a signal output.

The above and other objects, features, and advantages of this invention will be better understood from the following detailed description taken in conjunction with the accompanying drawings wherein all corresponding parts of the various figures are designated by the same numerals or letters.

DESCRIPTION OF THE PREFERRED EMBODIMENTS

Figure 1:
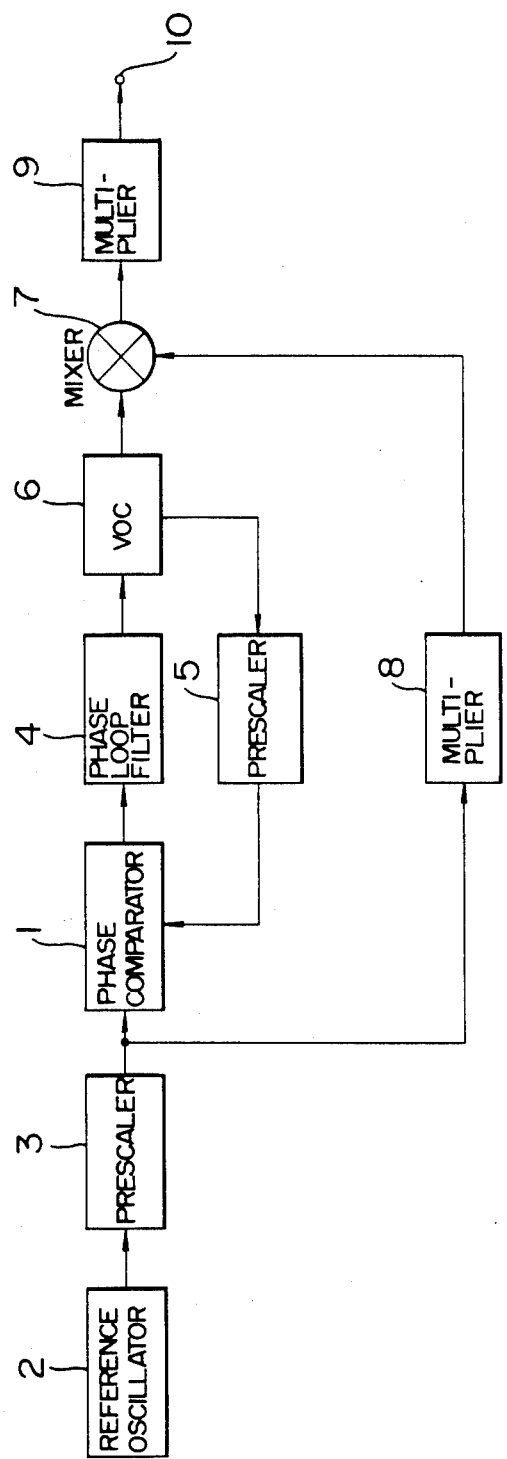
FIG. 1 is a block diagram of a prior art frequency synthesizer.
Figure 2:
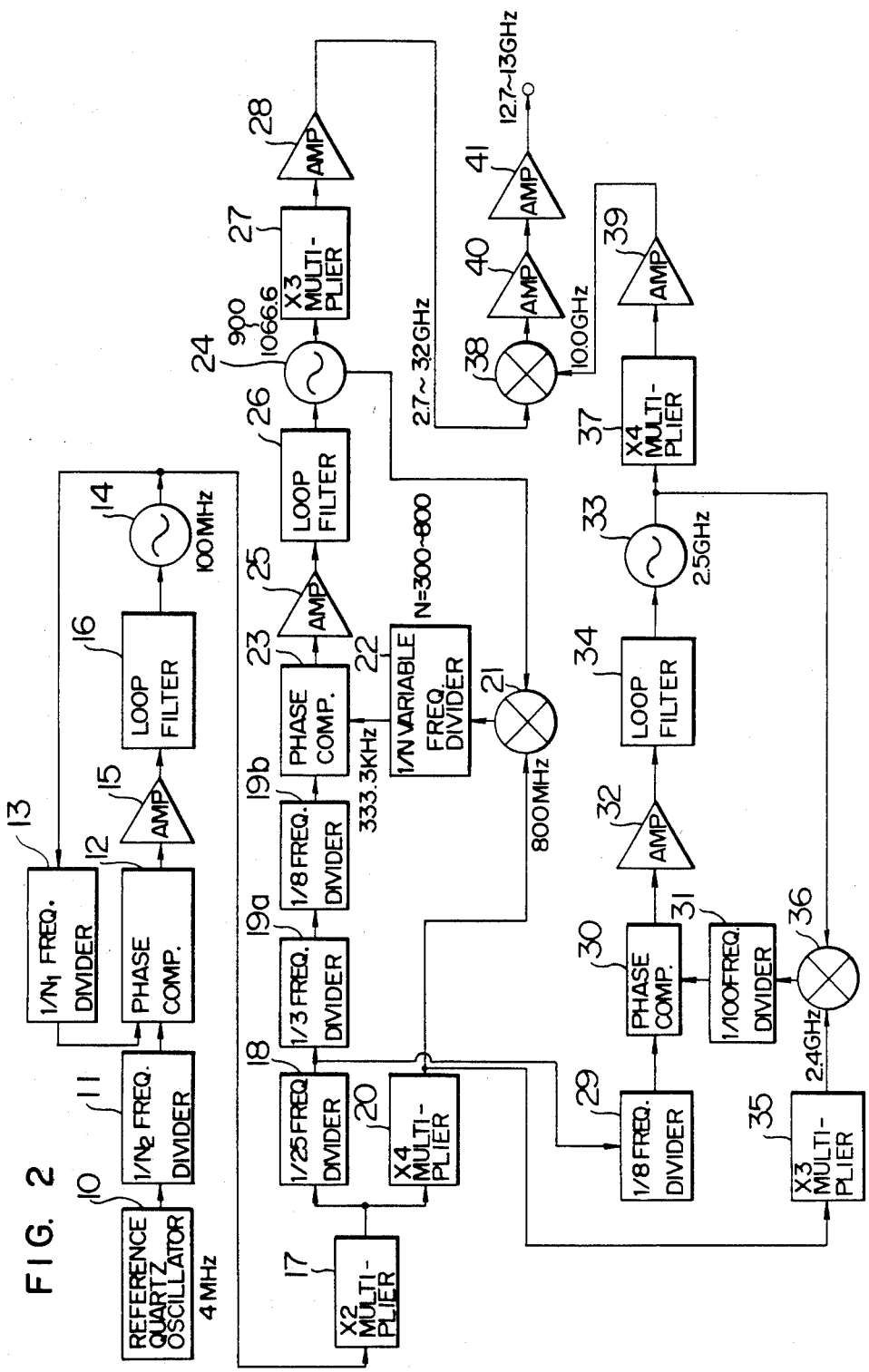
FIG. 2 is a block diagram of a frequency synthesizer in accordance with one embodiment of this invention.

Referring to FIG. 2, a frequency synthesizer in accordance with a first embodiment of this invention will be explained below.

In this figure, 10 is a reference quarts oscillator for generating reference signals, 11 is a frequency divider for dividing the output from reference quartz oscillator 10 into $1/N_2$, 12 is a phase comparator or phase detector for comparing $1/N_2$ frequency divider 11 with a $1/N_1$ frequency divider 13 in their phase, 14 is a voltage controlled oscillator (VCO) for generating an oscillation signal corresponding to the output from a loop filter 16 via an amplifier 15, 17 is a X2 multiplier for 2-multiplying the output frequency from VCO 14, 18 is a 1/25 frequency divider for dividing the output frequency from X2 multiplier 17 into 1/25, the output from which is further divided into 1/24 by a ½ frequency divider 19a and ½ frequency divider 19b, 20 is a X4 multiplier for further 4-multiplying the output frequency from X2 multiplier 20, 21 is a mixer for mixing the output from X4 multiplier 20 and that from a VCO 24 that will be explained later, 22 is a 1/N variable frequency divider for variable-dividing the output frequency from mixer 21, 23 is a phase comparator for comparing ½ frequency divider 19 with 1/N variable frequency divider 22 in their phase, 24 is a VCO for generating an oscillation signal corresponding to the output from a loop filter 26 via an amplifier 25, 27 is a X3 multiplier for 3-multiplying the output from VCO 24, 28 is an amplifier for amplifying the output from X3 multiplier 27, 29 is a ½ frequency divider for further dividing the output from 1/25 frequency divider into ½, 30 is a phase comparator for comparing the output from ½ frequency divider 29 with that from a 1/100 frequency divider 31 in their phase, 32 is an amplifier for amplifying the output from phase comparator 30, 33 is a VCO for generating an oscillation signal corresponding to the output from a loop filter 34, 35 is a X3 multiplier for further 3-multiplying the output frequency from X4 multiplier, 36 is a mixer for mixing the output from X3 multiplier 35 with the output from VCO 33, 37 is a X4 multiplier for multiplying the output frequency from VCO 33, 38 is a mixer for mixing the output from amplifier 27 via amplifier 28 with that from amplifier 37 via amplifier 39, and 40, 41 are amplifiers.

The operation in the arrangement mentioned above will be explained below.

First, the reference signal from VCO 14 is stabilized by a first phase-locked loop comprised of reference quartz oscillator 10, $1/N_2$ frequency divider 11, phase comparator 12, amplifier 15, loop filter 16 and $1/N_1$ frequency divider 13. More specifically, VCO 14 provides e.g. 100 MHz and its stability is inferior to reference quartz oscillator 10 but its phase noise is smaller than the latter so that this first phase-locked loop provides a low-noise and highly stabilized reference signal. The reference signal from VCO 14 is sent to ⅓ frequency divider 19a and ⅓ frequency divider 29 of the respective phase-locked loops through X2 multiplier 17 and 1/25 frequency divider. Incidentally, as reference quartz oscillator 10, there is used a highly stabilized oscillator having a reference frequency of e.g. 4 MHz, temperature controlled in a thermoregulator bath.

Multiplier 17 to which the reference signal is sent from VCO 14 forms a second phase-locked loop together with frequency dividers 18, 19a, 19b and 22, multiplier 20, phase comparator 23, amplifier 25, loop filter 26, and VCO 24; the second phase-locked loop provides signals at a variable frequency. Phase comparator 23 is supplied with the output from VCO with its frequency divided into 1/300 and the output from VCO 24 is phase-lock stabilized using the output of phase comparator as a reference. This output from VCO 24 can be varied in its frequency by changing the division number of 1/N variable frequency divider 22 in the range of e.g. 300–800 in accordance with the desired frequency range. The output from phase comparator 23 is sent to VCO 24 via amplifier 25 and loop filter 26, and accordingly VCO 24 produces a stabilized signal set at a frequency of 900–1066.6 MHz. This signal is 3-multiplied in its frequency by X3 multiplier and also is mixed with the signal of 800 MHz obtained by 8-multiplying the output from VCO 14 by mixer 21. The frequency-converted signal thus obtained is sent to 1/N variable frequency divider 22.

⅓ phase divider 29 to which the output from 1/25 phase divider 18 is sent and X3 multiplier 35 to which the output from X4 multiplier 20 is sent form a third phase-locked loop together with phase comparator 30, 1/100 frequency divider 31, amplifier 32, loop filter 34, VCO 33 and mixer 36.

VCO 33 in the third phase-locked loop is set at the frequency of e.g. 2500 MHz. To this end, the output signal of 2400 MHz, obtained by 24-multiplying the output from VCO 14 is frequency-converted by mixer 36 and is sent to phase comparator 30 via fixed 1/100 frequency divider 31. The 1/100 frequency divided signal from VCO 14 is also sent to this phase comparator 30 as a reference signal. Thus, the output from VCO 33 is stabilized by a control signal from loop filter 34. (Since this VCO 33 is set at a fixed frequency of 2500 MHz, an oscillator of a smaller variable-frequency range is used as VCO 33, i.e., for example, the used resonator is a dielectric resonator.) The output signal from VCO 33 is 4-frequency-multiplied by multiplier 37 to obtain a signal at 10,000 MHz. On the other hand, the output signal from the second phase-locked loop is 3-frequency-multiplied by multiplier 27 to obtain a signal at a variable frequency of e.g. 2700–3200 MHz. These two signals are frequency-converted by mixer 38, and the output from mixer 38 is amplified by amplifiers 40 and 41. Thus, a microwave frequency synthesizer providing the signals, e.g., at a frequency of 12700 MHz–13200 MHz and with a microwave output of 1 mW or more can be obtained.

As mentioned above, in accordance with this embodiment, a highly stabilized (e.g. $10^{-8}$/year) and low noise (e.g. phase noise of $-120$ dBc/Hz at a frequency apart from the carrier signal by 1 KHz) signal source is obtained by a first phase-locked loop, and it is used as a reference for further provided two phase-locked loop so that a highly stabilized and low noise signal can be obtained as a microwave signal output.

Accordingly, in accordance with the first embodiment of this invention, there is provided a low noise frequency synthesizer by constituting a low noise and highly stabilized reference oscillator by a first phase-locked loop and providing it with further two phase-locked loops each having a stabilized voltage controlled oscillator, the signal outputs from which are frequency-converted with as small multiplication factors or numbers as possible. This frequency synthesizer can minimize the phase noise that may be generated by frequency dividers in a digital system and so has a great industrial value.

Figure 3:
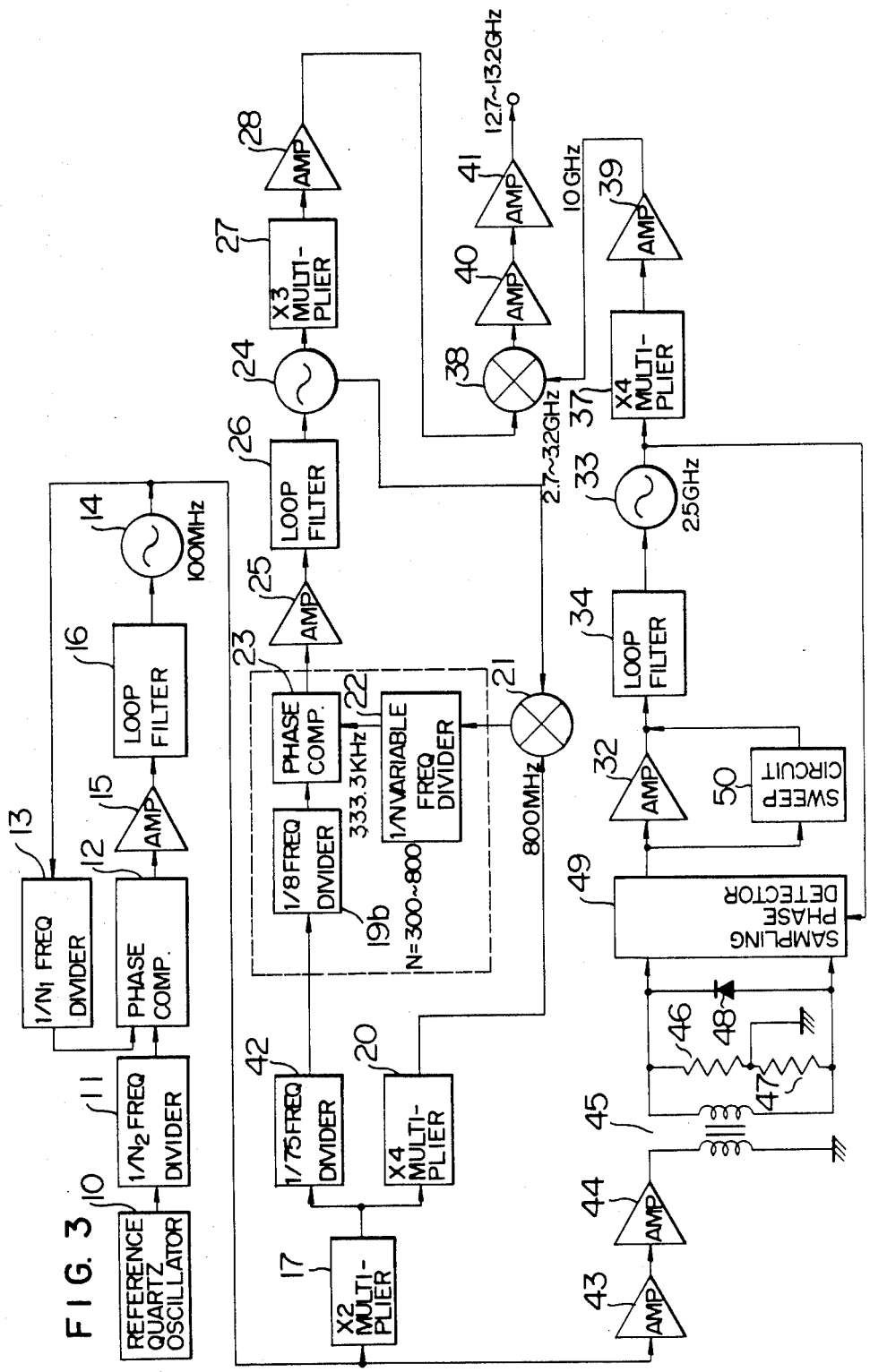
FIGS. 3 to 7 are block diagrams of frequency synthesizers in accordance with other various embodiments of this invention.

A second embodiment of this invention will be explained with reference to FIG. 3.

The second embodiment is the same as the first embodiment except that the output from X2 multiplier 17 is directly frequency-divided into 1/75 by a 1/75 frequency divider 42 and the divided signal is sent to ⅓ frequency divider 19b, and the third phase-locked loop has an arrangement different from that in the first embodiment.

The third phase-locked loop in this second embodiment provides a signal at a fixed frequency through the arrangement comprised of amplifiers 43 and 44 to which the reference signal from VCO 14 is sent, a step-recovery diode 48, a sampling phase detector 49, loop filter 34 and VCO 33.

In this third phase-locked loop, the output from VCO, stabilized in the first phase-locked loop is sent to step recovery diode 48 via amplifiers 43, 44 and a coupler 45. Step recovery diode 48 produces higher harmonics, which are applied to sampling phase detector 49. On the other hand, the output from VCO 33 is also applied to sampling phase detector 49. A phase comparison signal therebetween is sent again to VCO 33 via loop filter 34 and stabilized. In such an arrangement, the output from VCO 33 providing signals at 2500 MHz is stabilized by a simpler circuit. VCO 33 may have a comparatively narrow variable frequency range so that the used resonator can be made of dielectric materials or the like. The stabilized output from VCO 33 is 4-frequency multiplied by multiplier 37, amplified by amplifier 37, and thereafter applied to mixer 38. On the other hand, the output from VCO 24, stabilized in the second phase-locked loop is also 3-frequency-multiplied by multiplier 27, amplified by amplifier 28, and thereafter applied to mixer 38. The signal at e.g. 2700–3200 MHz from the second phase-locked loop and the signal at e.g. 10 GHz from the third phase-locked loop are frequency-converted by mixer 38, thereby providing an output signal at 12700–13200 MHz.

In accordance with this embodiment, simplification of the circuit and low noise can be implemented by providing a low noise and highly stabilized quartz oscillator in the first phase-locked loop, using it as a reference signal source for the oscillators in the second and third phase-lock loops, making the frequency variable using a variable frequency divider in the second phase-locked loop and using an analog phase-locked loop as the third phase-locked loop.

Accordingly, in accordance with the second embodiment of this invention, as in the first embodiment, there is provided a low noise frequency synthesizer by constituting a low noise frequency synthesizer by constituting a low noise and highly stabilized reference oscillator by a first phase-locked loop and providing it with further two phase-loops in which the output from the voltage controlled oscillator in each loop is stabilized and the signal output from each of which is frequency-converted with a smaller multiplication factor. Particularly, in this embodiment, since one of the further phase-locked loops is constituted as an analog system, the frequency synthesizer can greatly minimize the phase noise that may be generated by frequency dividers in a digital system and so has a great industrial value.

Figure 4:
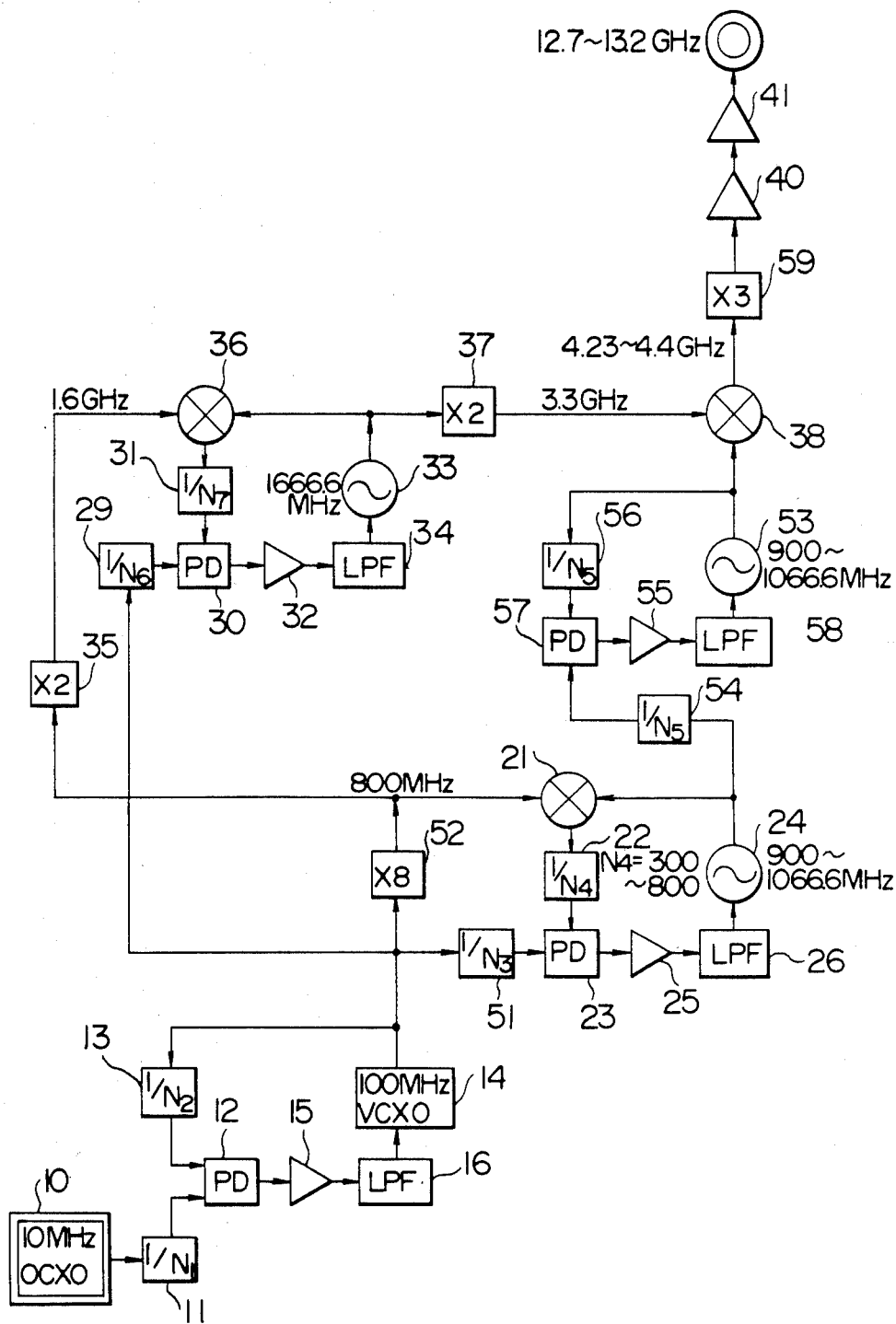

Referring to FIG. 4, a microwave frequency synthesizer in accordance with a third embodiment of this invention will be explained below.

In the first phase-locked loop, the output from VCO (voltage controlled quartz oscillator) 14 is stabilized by reference quartz oscillator 10 that is a highly stabilized oscillator temperature-controlled in a thermoregulator bath and produces signals at e.g. 10 MHz. VCO 14 producing signals at 3. g. 100 MHz is inferior to reference oscillator 10 in their stability but the phase noise at a large offset frequency from the carrier signal is smaller than the latter. Therefore, by suitably selecting the natural frequency in the first phase-locked loop, it is possible to discriminate the ranges of the detuned frequencies in which both oscillators contribute to the phase noise at the output of the loop, such as reference oscillator 10 setted at low natural frequency contributes to the phase noise in small offset frequency and VCO 14 setted at high natural frequency contributes to the phase noise in large offset frequency, thus providing a low noise and highly stabilized reference signal.

Next, using as a reference signal the output from the first phase-locked loop, two stabilized oscillation signals are provided through two phase-locked loops. One is a signal at a variable frequency through a second phase-locked loop while the other is a signal at a fixed frequency through a fourth phase-locked loop.

In the second phase-locked loop, VCO 24 is set at the range of e.g. 900 MHz–1066.6 MHz in its oscillation frequency. The output from VCO 24 is frequency-converted in mixer 21 with the signal at 800 MHz that is 8-multiplied output from VCO 14 by a X8 multiplier 52. This frequency-converted signal is sent to variable frequency divider 22 to provide a comparison signal, which is sent to phase comparator 23. Phase comparator 23 compares this comparison signal with the signal obtained by frequency-dividing the output from VCO 14 into 1/300 by a frequency divider 51. Using as a reference signal the output from the phase comparator, the output from VCO 24 is phase-lock stabilized via amplifier 25 and loop filter 26. The frequency of this output is varied in accordance with the frequency division number. For example, the division number is varied in the range of 300 to 800 in accordance with the frequency range (900 MHz–1066.6 MHz) set as above.

In the third phase-locked loop, a VCO 53 is set at the range of e.g. 900 MHz–1066.6 MHz in its oscillation frequency. The output from VCO 53 is sent to a fixed frequency divider 56 to provide a phase comparison signal, which is sent to a phase comparator 57. Phase comparator 57 compares the phase comparison signal with the signal obtained by frequency-dividing the VCO 14 output in the second loop by a fixed frequency divider 54 set at the same division number as in fixed frequency divider 56. Using as a reference signal the output from the phase comparator 57, the output from VCO 53 is phase-lock stabilized via an amplifier 55 and a loop filter 58. In this way, the frequency division number in the third phase-locked loop is fixed but the comparison frequency is varied so that the output frequency of VCO 53 is varied in the range of 900 MHz–1066.6 MHz.

In the fourth phase-locked loop, VCO 33 is set at e.g. 1666.6 MHz in its oscillation frequency. The output signal from VCO 33 is frequency converted in mixer 36 with the signal at 1600 Hz that is obtained by 16-multiplying the VCO 14 output by X8 multiplier 52 and X2 multiplier 35. This frequency-converted signal is sent to fixed frequency divider 31 to provide a comparison signal, which is sent to phase comparator 30. Phase comparator 30 compares this comparison signal with the signal obtained by frequency-dividing the VCO 14 output into 1/120 by frequency divider 29. Using as a reference signal the output from the phase comparator, the output from VCO 33 is phase-lock stabilized via amplifier 32 and loop filter 34. This VCO 33 is set at a fixed frequency, e.g. 1666.6 MHz in its oscillation frequency so that an oscillator providing less frequency variation is used as VCO 33, i.e., for example, the used resonator is made of dielectric material.

Moreover, the fourth phase-locked loop may not be set at a fixed frequency but a narrower variable frequency band corresponding to e.g. 3 channels; this can be implemented by using a channels as a unit of the variable frequency to be set in the third phase-locked channel. In this case, using variable frequency dividers in both third and fourth phase-locked loops, the associated frequencies can be set by varying the division numbers therein.

The output from VCO 33 is 2-frequency multiplied to provide a signal at 3333.3 MHz.

The output signals from these third and fourth phase-locked loops are frequency-converted by mixer 38. The resultant signal is 3-frequency-multiplied by X3 multiplier 59 and amplified by amplifiers 40 and 41. Thus, a microwave frequency synthesizer providing the signals, e.g. at 12700 MHz–13200 MHz and with a microwave output of 1 mW or more can be obtained.

In accordance with this embodiment, a highly stabilized (e.g. $10^{-8}$/year) and low noise (e.g. phase noise of $-120$ dBc/Hz at a frequency apart from the carrier signal by 1 KHz) signal source is obtained by a first phase-locked loop and it is used as a reference so that a highly stabilized and low noise signal can be obtained as a microwave signal output in such a way that the natural frequencies in further provided phase-locked loops are increased and the numbers of frequency multiplication and division are decreased.

Accordingly, there can be realized a microwave frequency synthesizer capable of providing highly stabilized and low noise signals in a wide microwave band reaching K band or so.

Explanation will be given for a fourth embodiment of this invention with reference to FIG. 5. This embodiment is substantially the same as the third embodiment of FIG. 4 except that the third phase-locked loop in FIG. 4 is modified.

In this embodiment, the third phase-locked loop includes VCO 53 with its oscillation frequency set at the range of 900 MHz–1066.6 MHz. The output from VCO 53 is frequency-converted in a mixer 61 with the signal at 800 MHz that is a 8-multiplied output from VCO 14 by X8 multiplier 52. This frequency-converted signal is sent to fixed frequency divider 56 to provide a comparison signal, which is sent to phase comparator 57. Phase comparator 57 compares this phase comparison signal with the signal obtained by frequency-dividing the mixer 21 output in the second phase-locked loop by fixed frequency divider 54 set at the same division number in fixed frequency divider 56. Using as a reference signal the output from the phase comparator, the output from VCO 53 is phase-lock stabilized via amplifier 55 and loop filter 58. In this way, the frequency division number in the third phase-locked loop is fixed but the comparison frequency is varied so that the output frequency of VCO 53 is varied in the range of 900 MHz–1066.6 MHz.

Figure 6:
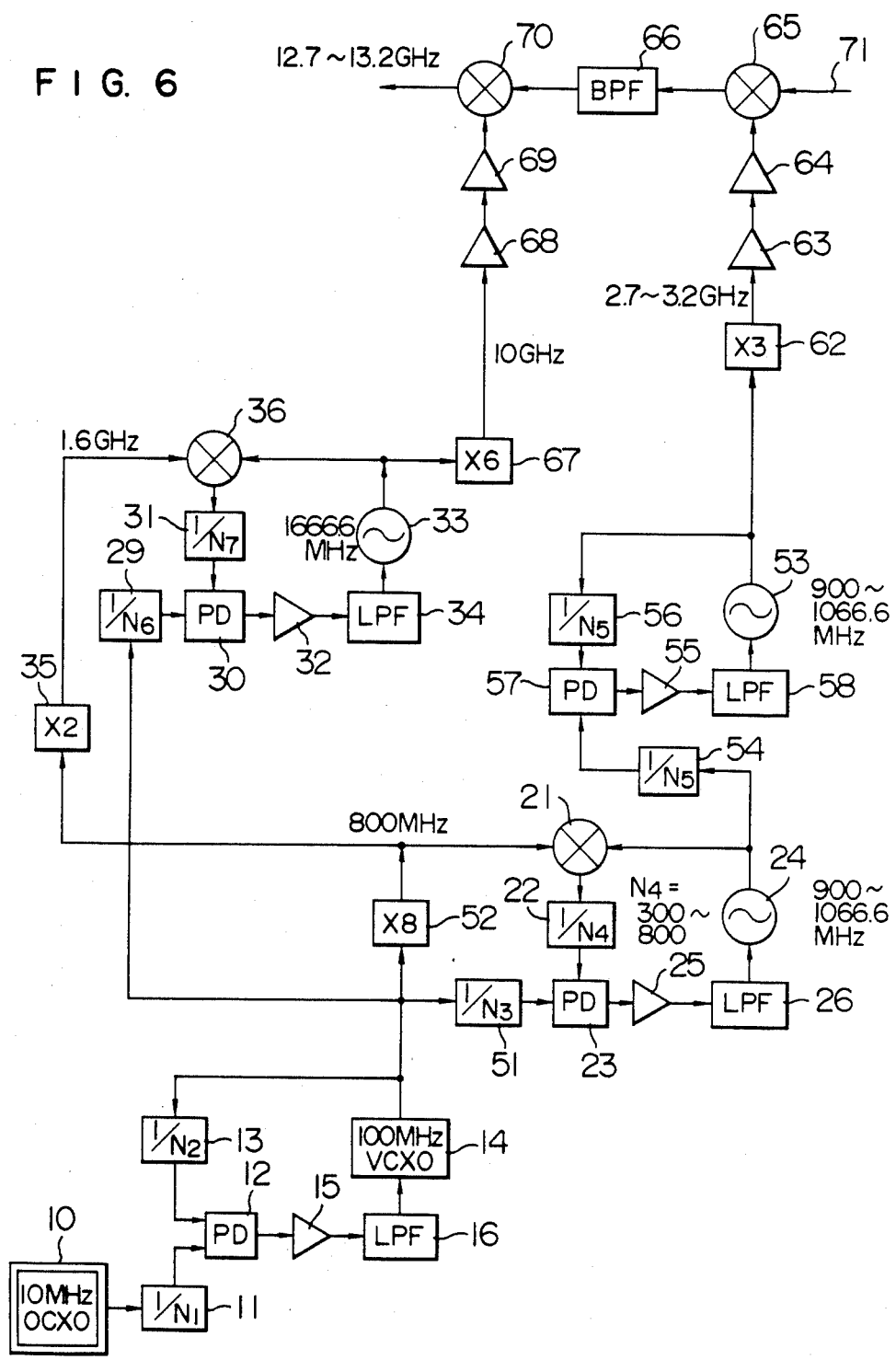

FIG. 6 shows a fifth embodiment of this invention.

In this embodiment, the carrier signal 71 is frequency-converted in mixer 65 with a first local oscillation signal, obtained by 3-frequency-multiplying the third loop output by X3 multiplier 62 and amplifying it by amplifiers 63 and 64, band-pass-filtered by a bandpass filter 66 and further frequency-converted in mixer 70 with a second local oscillation signal, obtained by 6-frequency-multiplying the fourth loop output by X6 multiplier 67 and amplifying it by amplifiers 68 and 69. Thus, a microwave frequency synthesizer provided with first and second local oscillators can be obtained.

Figure 7:
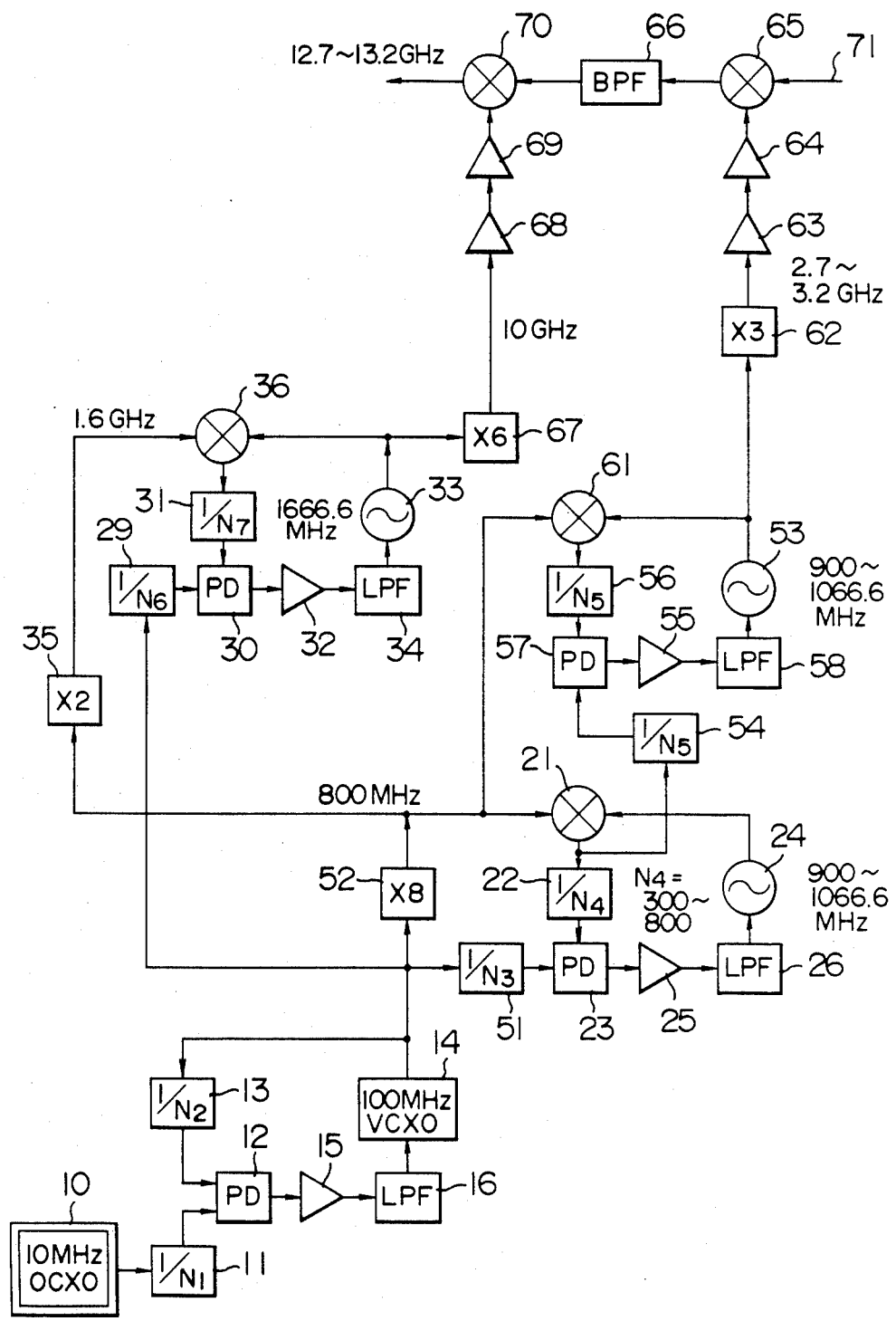

FIG. 7 shows a sixth embodiment of this invention. This embodiment is substantially the same as the fifth embodiment except that the third phase-locked loop in FIG. 6 is modified in the same manner as in FIG. 5.

In this embodiment, the third phase-locked loop includes VCO 53 with its oscillation frequency set at the range of 900 MHz–1066.6 MHz. The output from VCO 53 is frequency-converted in mixer 61 with the signal at 800 MHz that is a 8-multiplied output VCO 14 by X8 multiplier 52. This frequency-converted signal is sent to fixed frequency divider 56 to provide a comparison signal, which is sent to phase comparator 57. Phase comparator 57 compares this comparison signal with the signal obtained by frequency-dividing the mixer 21 output in the second phase-locked loop by fixed frequency divider 54 set at the same division number in fixed frequency divider 56. Using as a reference signal the output from the phase comparator, the output from VCO 53 is phase-lock stabilized via amplifier 55 and loop filter 58. In this way, the frequency division number in the third phase-locked loop is fixed but the comparison frequency is varied so that the output frequency of VCO 53 is in the range of 900 MHz–1066.6 MHz.

Figure 5:
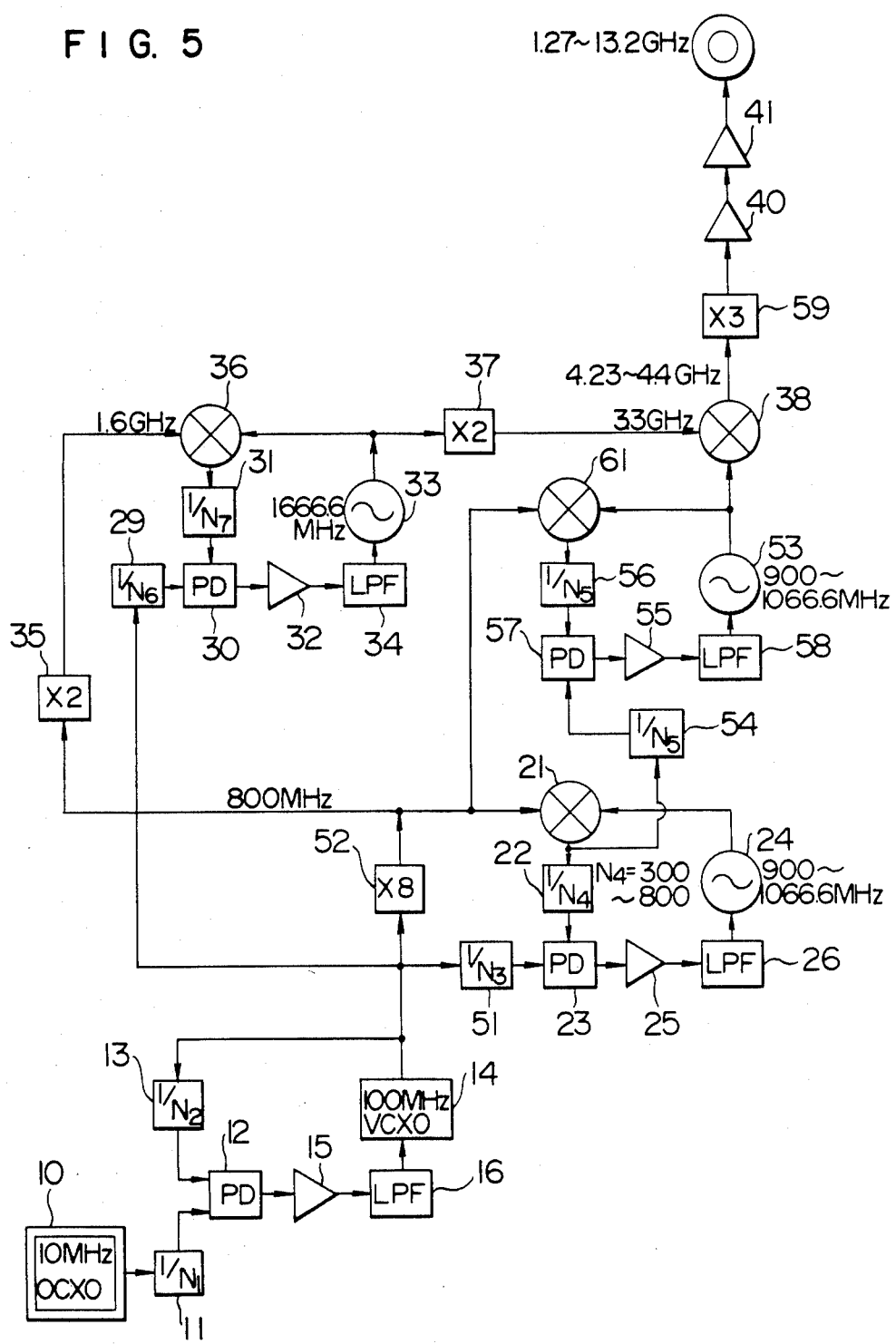

All the embodiments shown in FIGS. 5 to 7 provide the same advantageous effect as in the embodiment shown in FIG. 4.

We claim:

1. A frequency synthesizer comprising;
   first phase-locked loop means having a first voltage-controlled oscillator (VCO) phase-lock-stabilized using a reference quartz oscillator,
   second phase-locked loop means having a second voltage-controlled oscillator, for frequency-converting a signal associated with an output from said first VCO and its own output signal so as to provide a first phase-comparison signal,
   third phase-locked loop means having a third VCO, for creating a second phase comparison signal from the first VCO output and its own output, and
   frequency-converting means for creating a microwave signal frequency-converted from a first signal associated with the output from said second phase-locked loop means and a second signal associated with the output from said third phase-locked loop means.

2. A frequency synthesizer according to claim 1, wherein said third phase-locked loop means provides said second phase comparison signal by frequency-converting its own output signal and a signal obtained by multiplying said first VCO output.

3. A frequency synthesizer according to claim 1, wherein said frequency converting means provides said microwave signal on the basis of the signals obtained by multiplying said second and third VCO outputs.

4. A frequency synthesizer according to claim 1, wherein said reference oscillator is a quartz oscillator temperature-stabilized in a thermoregulator bath, and said first VCO is a low noise quartz oscillator.

5. A frequency synthesizer according to claim 1, wherein said second phase-locked loop means includes a variable frequency divider to follow the frequency conversion means and to provide a variable frequency from the second VCO by varying its frequency division number.

6. A frequency synthesizer according to claim 2, wherein said third phase-locked loop means includes a fixed frequency divider subsequent to frequency-conversion means, and a phase comparator for phase-comparing the output from the fixed frequency divider with the signal obtained by multiplying or dividing the first VCO output in its frequency.

7. A frequency synthesizer according to claim 3, wherein said frequency converting means provides said microwave signal by frequency-converting a signal obtained by 4-multiplying the signal at a fixed frequency from said third VCO and a signal obtained by 3-multiplying the signal at a variable frequency from said second VCO.

8. A frequency synthesizer according to claim 1, wherein said third phase-locked loop means includes a sampling phase detecting circuit for providing said comparison signal by applying to it the output from said third VCO and a higher harmonic obtained by applying the first VCO output to a step recovery diode.

9. A frequency synthesizer according to claim 8, wherein said sampling phase detecting circuit is supplied with said higher harmonic serving as a reference signal and directly with said third VCO output so as to provide a stabilized signal through the phase comparison therebetween.

10. A frequency synthesizer according to claim 1, further comprising fourth phase-locked loop means having a fourth VCO with its oscillation frequency set at the same variable frequency as the second phase-locked loop means, using as a reference the signal obtained by fixedly dividing the output from the second phase-locked loop means, and the output from said fourth phase-locked loop means is used as said first signal.

11. A frequency synthesizer according to claim 10, wherein said fourth phase-locked loop means includes a phase comparator for phase-comparing the second VCO output as a reference signal with the signal obtained by fixedly dividing the fourth VCO output.

12. A frequency synthesizer according to claim 10, wherein the variably set entire frequency width in the third phase-locked loop is used as a unit width of the variably set frequency in the fourth phase-locked loop so that the oscillation frequencies in said third and fourth VCO can be set by controlling the division numbers in variable frequency dividers included in the third and fourth phase-locked means.

13. A frequency synthesizer according to claim 10, wherein said fourth phase-locked loop means includes a phase comparator for phase-comparing a reference signal obtained by frequency-converting the output from the second phase locked loop and fixedly dividing it, with the output obtained by frequency-converting the fourth VCO output and the signal obtained by multiplying the first VCO output.

14. A frequency synthesizer according to claim 10, wherein the outputs from said fourth and third phase-locked loop means are used respectively as first and second local oscillation sources so as to frequency-convert a carrier signal.

15. A frequency synthesizer comprising:
first phase-locked loop means having a first voltage controlled oscillator (VCO) phase-lock-stabilized using a reference quartz oscillator;
second phase-locked loop means having a second VCO, for frequency-converting the signal obtained by multiplying the output of said first VCO and its own output signal so as to provide a phase comparison signal;
third phase-locked loop means having a third VCO, for frequency-converting the signal obtained by multiplying the first VCO output and its own output signal so as to provide a second phase comparison signal, and
frequency-converting means for frequency-converting a first signal obtained by frequency-multiplying the output from said second phase-locked loop means and a second signal obtained by frequency-multiplying the output from said third phase-locked loop means.

16. A frequency synthesizer according to claim 15, wherein said reference oscillator is a quartz oscillator temperature-controlled in a thermoregulator bath, and said first VCO is a low noise quartz oscillator.

17. A frequency synthesizer according to claim 15, wherein said second phase-locked loop means includes a variable frequency divider subsequent to frequency-conversion means, and said variable frequency divider provides a variable frequency in the second VCO by varying its frequency division number.

18. A frequency synthesizer according to claim 15, wherein said third phase-locked loop means includes a fixed frequency divider subsequent to frequency-conversion means, and a phase comparator for phase-comparing the output from the fixed frequency divider with the signal obtained by multiplying or dividing the first VCO output in its frequency.

19. A frequency synthesizer comprising:
a first phase-locked loop (PLL) for phase-lock stabilizing a first voltage controlled oscillator (VCO) included therein at a fixed frequency using a reference quartz oscillator;
a second phase-locked loop having a second VCO st at a variable frequency using as a reference the output from said first PLL, the output from the second VCO and the signal obtained by multiplying the output from said first VCO being frequency-converted to a signal at a decreased frequency and phase comparison in the second PLL being made to phase-lock stabilize said second VCO;
a third phase-locked loop having a third VCO set at a variable frequency using as a reference the signal obtained by fixedly frequency dividing the frequency-converted output from said second PLL, the output from said third VCO and the signal obtained by multiplying the output from said first VCO being frequency-converted to a signal at a decreased frequency and phase comparison in the third PLL being made to phase-lock stabilize said third VCO, and
a fourth phase-locked loop having a fourth VCO using as a reference the output from said first PLL, the output from said fourth VCO and a signal obtained by multiplying the output from the first VCO being frequency-converted to a signal at a decreased frequency and phase comparison in the fourth PLL being made to phase-lock stabilize said fourth VCO, whereby a microwave signal is produced on the basis of a first signal from said third PLL and a second signal from said fourth PLL.

20. A frequency synthesizer according to claim 19, wherein said microwave signal is produced by frequency-converting the first signal from said third PLL and the second signal from said fourth PLL.

21. A frequency synthesizer according to claim 19, wherein the outputs from said third and fourth PLL's are used respectively as first and second local oscillation sources so as to frequency-convert a carrier signal.

22. A frequency synthesizer comprising:
a first phase-locked loop (PLL) for phase-lock-stabilizing a first voltage controlled oscillator (VCO) included therein at a fixed frequency using a reference quartz oscillator;
a second phase-locked loop having a second VCO set at a variable frequency using as a reference the output from said first PLL, the output from said second VCO and the signal obtained by multiplying the output from said first VCO being frequency-converted to a signal at a decreased frequency and phase comparison in the second PLL being made to phase-lock stabilize said second VCO;
a third phase-locked loop having a third VCO set at the same variable frequency as the second PLL, using as a reference the signal obtained by fixedly dividing the output from the second VCO, phase comparison in the third PLL being made between the reference and a signal obtained by fixedly dividing the output from the third VCO so as to phase-lock stabilize the said third VCO, and
a fourth phase-locked loop having a fourth VCO using as a reference the output from said first PLL, the output from said fourth VCO and a signal obtained by multiplying the output from the first VCO being frequency-converted to a signal at a decreased frequency and phase comparison in the fourth PLL being made to phase-lock stabilize said fourth VCO, whereby a microwave signal is produced on the basis of a first signal from said third PLL and a second signal from said fourth PLL.

23. A frequency synthesizer according to claim 22, wherein said microwave signal is produced by frequency-converting the first signal from said third PLL and the second signal from said fourth PLL.

24. A frequency synthesizer according to claim 23, wherein the outputs from said third and fourth PLL's are used respectively as first and second local oscillation sources so as to frequency-convert a carrier signal.

* * * * *